United States Patent [19]
Lodi

[11] 3,971,001
[45] July 20, 1976

[54] REPROGRAMMABLE READ ONLY VARIABLE THRESHOLD TRANSISTOR MEMORY WITH ISOLATED ADDRESSING BUFFER

[75] Inventor: Robert J. Lodi, Tewksbury, Mass.

[73] Assignee: Sperry Rand Corporation, New York, N.Y.

[22] Filed: June 10, 1974

[21] Appl. No.: 477,723

[52] U.S. Cl. ............................ 340/173 R; 307/279; 307/303; 357/47
[51] Int. Cl.² ..................... G11C 5/06; G11C 11/40
[58] Field of Search ..................... 340/173 R, 172.5; 307/304, 279, 303; 357/47, 48, 49

[56] References Cited
UNITED STATES PATENTS

| | | | |
|---|---|---|---|
| 3,618,051 | 11/1971 | Oleksiak | 340/173 R |
| 3,733,591 | 5/1973 | Cricchi | 340/173 R |
| 3,747,072 | 7/1973 | Lodi et al. | 340/173 R |
| 3,836,894 | 11/1974 | Cricchi | 340/173 R |
| 3,858,060 | 12/1974 | Kenyon | 340/173 R |

*Primary Examiner*—Stuart N. Hecker
*Attorney, Agent, or Firm*—Howard P. Terry; Albert B. Cooper

[57] ABSTRACT

A monolithic integrated circuit, fully decoded memory comprises a rectangular array of variable threshold field effect transistors organized into a plurality of multi-bit words. Binary address inputs to the memory are decoded by a field effect transistor decoder into a plurality of word selection lines each of which activates an address buffer circuit. Each address buffer circuit, in turn, drives a word line of the memory array. In accordance with the word line selected by the decoder the activated buffer circuit directs reading or writing voltages to the transistors comprising the memory words. All of the buffer circuits additionally are connected to a common terminal for clearing all of the memory transistors to a predetermined state by the application to the common terminal of a large magnitude voltage of a predetermined polarity. The address decoder, the buffer and the memory array, as well as control and input/output control and buffer field effect transistor circuits, are fabricated on a common substrate with means provided to isolate the substrate of the address buffer transistors from the remainder of the substrate so that the bulk clearing function of simultaneously placing all of the memory transistors into a predetermined state can be performed.

9 Claims, 3 Drawing Figures

REPROGRAMMABLE READ ONLY VARIABLE THRESHOLD TRANSISTOR MEMORY WITH ISOLATED ADDRESSING BUFFER

The invention described herein was made in the course of, or under, a subcontract for the benefit of the U.S. Atomic Energy Commission.

BACKGROUND OF THE INVENTION

1. Field of the Invention

The invention relates to memory circuits and more particularly to memory circuits utilizing variable threshold MNOS field effect transistors as memory elements.

2. Description of the Prior Art

Variable threshold field effect transistors are known in the art that may be utilized to form memory elements in computer memory arrays. Such a transistor is described in U.S. Pat. 3,590,337 entitled "Plural Dielectric Layered Electrically Alterable Non-Destructive Readout Memory Element", issued to H. A. R. Wegener on June 29, 1971 and assigned to the assignee of the present invention. Briefly, such transistors comprise source, drain and gate electrodes on a substrate and include a gate insulator that permits the conduction threshold of the transistor to be altered by the application of relatively large WRITE voltages between the gate electrode and the substrate. Binary valued thresholds may be established by the application of the WRITE voltages of opposite polarities respectively. The transistors are interrogated by applying a READ potential between the gate and substrate of a biased transistor, which READ potential is of a magnitude intermediate the established binary thresholds. The current drawn through the interrogated transistor is indicative of the established threshold and hence of the binary state of the element. Such memory readout is essentially non-destructive in that the application of the READ potential does not significantly alter the established threshold.

A variety of memory circuits have been devised utilizing the variable threshold transistors as memory cells, these circuits requiring various arrangements of READ and WRITE voltages and circuit configurations for performing these functions. The following U.S. Pat. Nos., which are assigned to the present assignee, exemplify such circuit arrangements: U.S. Pat. No. 3,508,211 entitled "Electrically Alterable Non-Destructive Readout Field Effect Transistor Memory", issued Apr. 21, 1970 to H. A. R. Wegener; U.S. Pat. No. 3,618,051 entitled "Non-Volative Read/Write Memory With Addressing" issued Nov. 2, 1971 to Robert E. Oleksiak; U.S. Pat. 3,691,535 entitled "Solid State Memory Array" issued Sept. 12, 1972 to Thomas R. Williams; and U.S. Pat. No. 3,747,072 entitled "Integrated Static MNOS Memory Circuit With Decoder" issued July 17, 1973 to Robert J. Lodi et al. Pending U.S. Pat. application Ser. No. 380,782, entitled "Integrated Variable Threshold MNOS Memory With Decoder and Operating Sequence", filed in the name of H. A. R. Wegener on July 19, 1973 and assigned to the assignee of the present invention, also describes such memory configurations.

In memory configurations such as those described in said U.S. Pat. Nos. 3,691,535; 3,618,051 and 3,747,072, it is often necessary to first set all of the memory cells to a predetermined state (which operation will hereinafter be designated as bulk clear) and then to switch selected memory transistors to the opposite state thereby establishing a desired data pattern for the memory. Preferably these memory arrays are fabricated as fully decoded, TTL logic compatible, monolithic circuit chips.

In order to perform the writing operations it is necessary to apply large magnitude positive and negative potentials between the gates and substrates of the memory transistors. A problem arises when utilizing a substrate such as an N type semi conductor on a P bulk material to form MOS P-channel transistors in that for one polarity of the large magnitude dual polarity voltages, the P-N junctions of the gate driving transistors for the memory array become forward biased thereby raising the entire substrate substantially to the level of the applied voltage. This action prevents the required large magnitude voltage from appearing between the gates and the substrates of the memory transistors.

A prior art solution to this problem has been to isolate the substrate of the memory transistors by an epitaxial layer and a diffused wall forming a PN-junction surrounding the memory array, as discussed in the aforesaid patents. Since the array of variable threshold memory transistors occupies a significant portion of the memory chip, the area required for isolation would necessarily be extensive. Isolation is effected by a reverse bias on the junction which in effect holds back the large magnitude voltages from the remainder of the chip thus permitting the above described clearing function to be performed. Such a large isolation junction adversely affects the manufacturing yield for such devices since when the junction area contains a defect (defects distributed over the area of the chip being unavoidable for reasonable manufacturing costs) voltage breakdown occurs across the isolation diffusion at the defect sites thereby causing rejection and discarding of the manufactured chip hence lowering the manufacturing yield and increasing the manufacturing costs.

One approach that may be utilized to avoid the extensive isolation diffusion would be to fabricate a plurality of additional conductors connected from a common terminal at the edge of the chip to the gate electrodes of all of the memory transistors respectively and to utilize the common terminals for the application of the appropriate polarity voltage. This approach is undesirable since it again significantly complicates the manufacturing procedures, hence markedly increasing manufacturing costs.

In addition to the above, these prior art memory arrangements utilize the word decoder and buffer inputs as well as the bit line terminals for the application of a plurality of precisely timed pulses to perform all of the necessary memory operations.

It is a primary object of the present invention to eliminate the necessity for extensive junction isolation and to include the capability of performing the bulk clear operation by the application of a single large magnitude pulse of a predetermined polarity to a single substrate terminal.

SUMMARY OF THE INVENTION

The afore-described limitations of the prior art devices are overcome by isolating the substrate of the addressing buffer from the remainder of the memory chip substrate so as to significantly reduce the size of the required isolation junction and additionally to apply the bulk clearing voltage pulse to all of the buffer circuits thereby setting all of the variable threshold memory transistors to the bulk clear predetermined state.

BRIEF DESCRIPTION OF THE DRAWING

FIG. 1 which is comprised of 1a and 1b is a schematic circuit diagram of a fully decoded, TTL logic compatible memory configuration utilizing variable threshold field effect transistor memory cells and arranged in accordance with the present invention.

DESCRIPTION OF THE PREFERRED EMBODIMENT

Figure 1A:
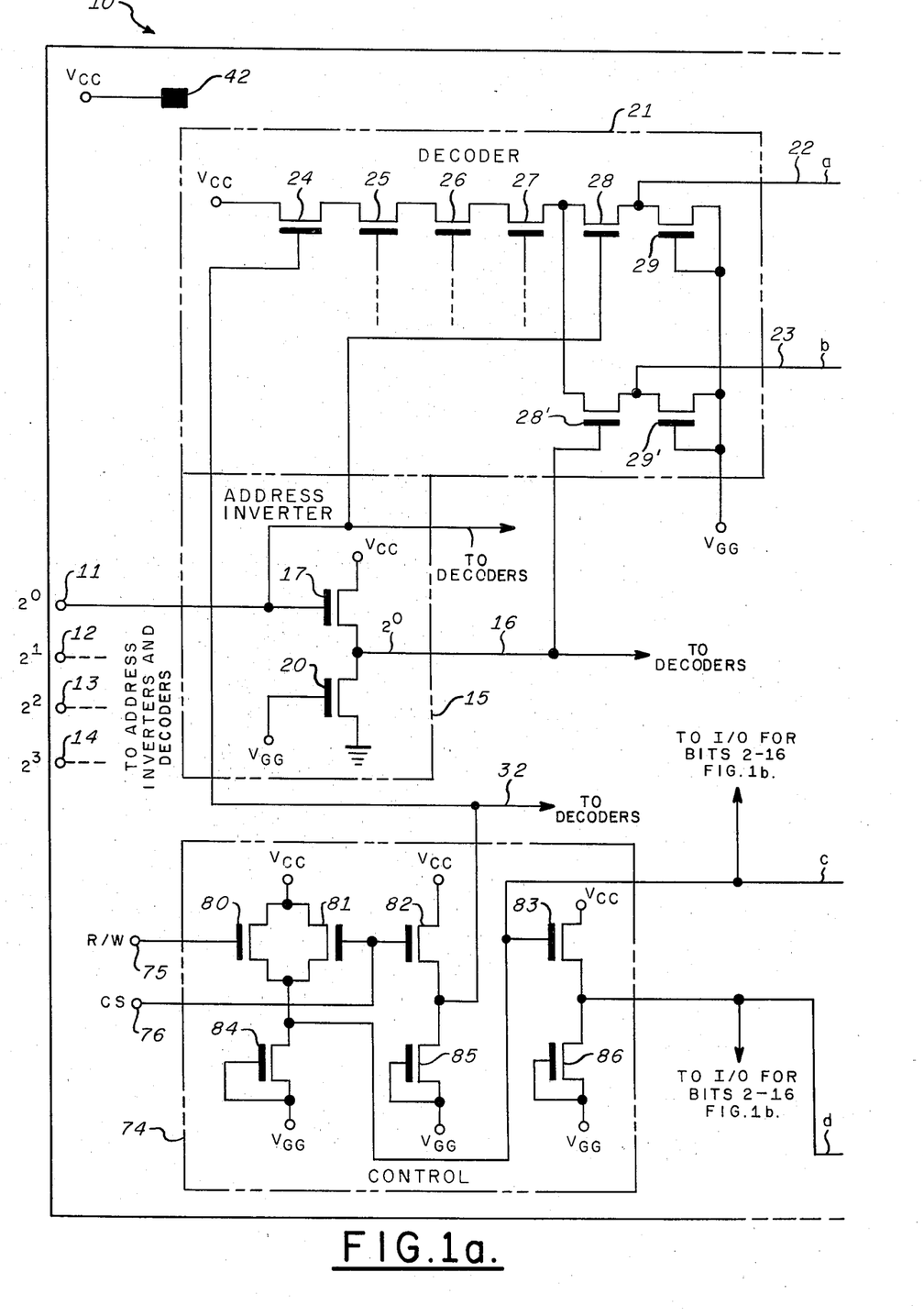
Figure 1B:
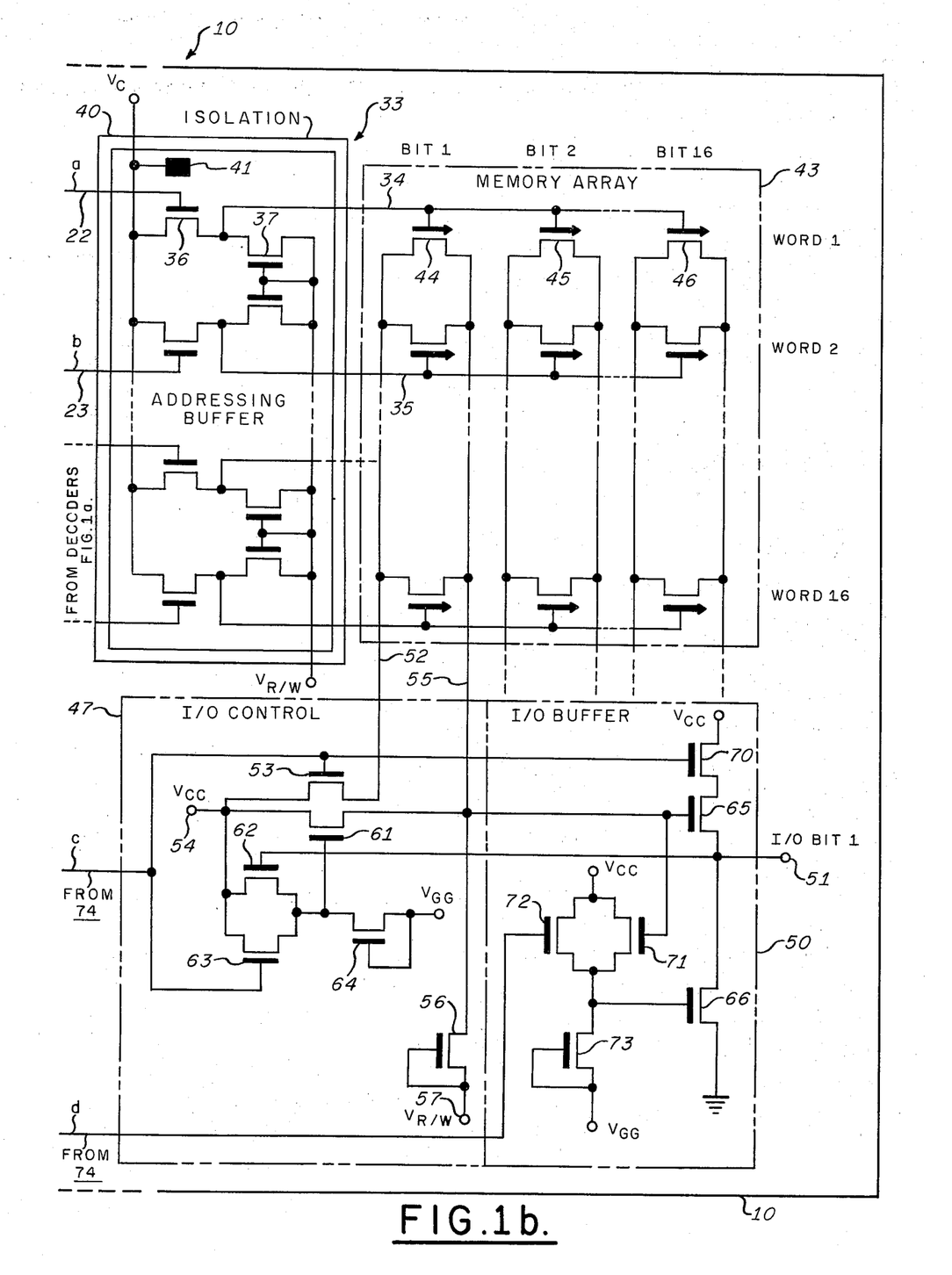

Referring to FIGS. 1a and 1b, an electrically reprogrammable read-only memory is illustrated. The entire memory including the storage elements, address decoder, buffers and control circuits are fabricated as an integrated circuit on a single chip 10. For purposes of discussion the chip 10 may be considered comprised of a relatively thick bulk layer of P-type semi-conductor material over which is deposited a relatively thin layer of N-type semi-conductor material. The sources and drains of fixed as well as variable threshold field effect transistors are fabricated as shallow P diffusions into the N layer. Source, drain and gate electrodes as well as interconnecting conductors and input and output terminals are deposited on or over the N-layer substrate to form the memory chip as illustrated. These fabrication techniques are well known in the art for manufacturing such configurations as described in said U.S. Pat. Nos. 3,590,337 and 3,691,535, for example. Such an arrangement results in MOS P-channel field effect transistors requiring operating and biasing potentials of given polarities to perform the memory operations of clearing, writing and reading. It will be appreciated that opposite conductivity materials as well as opposite polarity potentials may be utilized in practicing the invention with MOS N-channel devices. The variable threshold transistors providing the memory elements of the device are depicted with arrows on the schematic gate electrodes and the fixed threshold field effect transistors forming the peripheral memory circuitry are depicted without arrows on the schematic gate electrodes thereof. The memory illustrated is word organized having, for purposes of description, 16 words of 16 bits each.

In order to provide addressing for the 16 words input terminals, 11, 12, 13 and 14 are provided for a 4-bit parallel address word designated as $2^0$–$2^3$. The voltage levels for the input address bits may be provided by conventional TTL logic which levels may have values near 0 or 5 volts to denote the binary states thereof.

The $2^0$ address bit is applied through the terminal 11 to an address inverter 15 to provide the complement of the input bit on a lead 16. The address inverter 15 is comprised of two serially connected fixed threshold field effect transistors 17 and 20. The source of the transistor 17 is connected to the $V_{CC}$ power supply which typically provides +5 volts d.c. and the drain of the transistor 20 is connected to ground potential. The $2^0$ address bit is applied to the gate of the transistor 17 while the gate of the transistor 20 is connected to a $V_{GG}$ power supply which typically provides −12 volts d.c. The lead 16 which provides the inverted address bit is connected to the junction between the drain of the transistor 17 and the source of the transistor 20. It will be appreciated that the transistor 17 functions as the address bit inverter while the transistor 20 functions as the load transistor therefor.

Three additional address inverters (not shown) identical to the address inverter 15 are provided for the $2^1$, $2^2$ and $2^3$ address bits respectively.

The true and complemented address signals are applied to an address decoder 21 which, in turn, provides word selection signals on leads 22 and 23 for selecting words 1 and 2 of the memory. It will be appreciated that seven additional address decoders (not shown) identical to the decoder 21 are included to provide the word selection signals for selecting the remaining words of the memory. The decoder 21 in combination with the 7 additional decoders are arranged in a conventional tree configuration for decoding the 4-bit address into one of 16 word selection lines.

Each of the decoder blocks 21 is comprised of serially connected fixed threshold field effect transistors 24–29 and serially connected fixed threshold field effect transistors 28' and 29' connected in parallel across the transistors 28 and 29. The power supply $V_{CC}$ is connected to the source of the transistor 24 while the power supply $V_{GG}$ is connected to the commonly connected gates and drains of the transistors 29 and 29'. The transistor 24 functions as a decoder enabling switch in response to a control signal on a lead 32 connected to the gate thereof. The transistor 29 functions as the load element for the serially connected transistors 24–28 while the transistor 29' functions as the load element for the transistor 28'.

During the various operating modes of the memory the lead 32 applies either a high or a low voltage signal to the gate of the transistor 24 in the decoder block 21 as well as to the other corresponding transistors (not shown) in the remaining decoder blocks of the memory. These control voltage levels will hereinafter be referred to as HIGH and LOW respectively. Since for the purposes of description, all of the transistors on silicon chip 10 are considered as P-channel devices, a LOW at the gate of a fixed threshold transistor renders the transistor conductive and a HIGH at the gate thereof renders the transistor non-conductive. Thus a LOW provided by the lead 32 to the transistors 24 enables the address decoder whereas a HIGH disables the decoder. The addressing bits $2^1$ through $2^3$ and the complements thereof provided by the address inverters 15 are connected to the gates of the transistors 25, 26 and 27 in the decoder block 21 as well as to the gates of the corresponding transistors in the remaining decoder blocks in a conventional binary pattern such that one unique set of serially connected transistors 25, 26 and 27 is rendered conductive for each of the eight possible binary combinations of the address bits $2^1$ through $2^3$. By the connections shown to the gates of the transistors 28 and 28', the $2^0$ address bit controls which of these transistors is rendered conductive in each of the decoder blocks. Thus, it is appreciated that whenever the address decoder is enabled by rendering the transistors 24 conductive, the addressing bits $2^0$ through $2^3$ uniquely selects one of the 16 word selection lines such as 22 and 23 by placing a HIGH thereon, the remaining of the word selection lines being in the LOW state.

The 16 output leads from the address decoder are connected as inputs to an addressing buffer 33. For each of the word selection line inputs from the addressing decoder to the buffer 33, the buffer 33 provides a corresponding output to a memory word. For example, the word selection line 22 corresponds to a buffer output 34 to word 1 of the memory and the word selection line 23 corresponds to a buffer output 35 to word 2 of the memory. Each of the word selection lines from the address decoder and the corresponding buffer output has associated therewith an addressing buffer circuit comprised of two serially connected fixed threshold field effect transistors. For example, the word selection line 22 has associated therewith the two transistors 36 and 37. The addressing buffer 33 is therefore comprised of 16 identical 2-transistor addressing buffer circuits one of which will be described with regard to the transistors 36 and 37.

The word selection line 22 is connected to the gate of the transistor 36 which functions as an addressing buffer driver, the transistor 37 functioning as the load element therefor. The corresponding addressing buffer output 34 is connected to the junction between the drain of the transistor 36 and the source of the transistor 37.

In accordance with one aspect of the invention, in order to provide the bulk clearing function in a manner compatible with the other memory functions to be performed, the sources of all of the addressing buffer transistors corresponding to the transistor 36 are commonly connected to a terminal $V_C$ for reasons to be discussed. The gates and drains of all of the transistors corresponding to the transistor 37 are connected together and, in turn, commonly connected to a terminal $V_{R/W}$ to provide reading and writing potentials to the memory transistors in a manner to be described.

Figure 2:
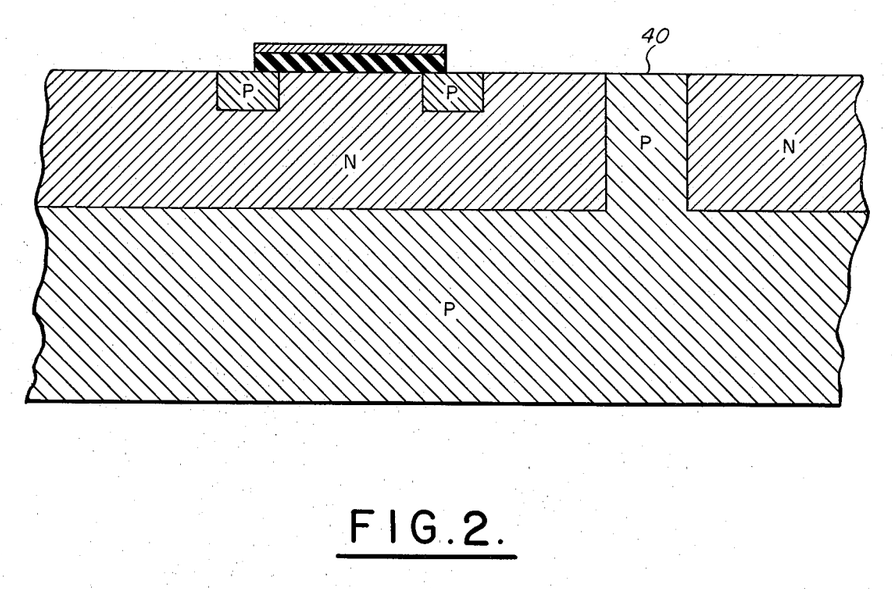
FIG. 2 is a cross section of a typical portion of the substrate described herein below.

In accordance with another aspect of the invention the substrate of the addressing buffer 33 is isolated from the rest of the chip 10 by an isolation diffusion 40. The diffusion 40 may be fabricated in a conventional manner in accordance with that described in said U.S. Pat. Nos. 3,618,051 and 3,691,535. Briefly, since the silicon chip 10 is comprised, in the example described, of P-bulk material overlaid with an N-type substrate, the isolation diffusion 40 would comprise a deep diffusion of P-type material penetrating through the entire thickness of the N-substrate and making contact with the underlying P-layer.

In order to operate in accordance with the invention, the isolated substrate of the addressing buffer 33 is connected to the $V_C$ terminal through a contact 41 while chip 10 is referenced to the $V_{CC}$ potential through a contact 42.

Also included on the chip 10 is an array 43 of variable threshold field effect memory transistors arranged in a rectangular configuration comprising, for example, 16 words of 16 bits each. Each bit or memory cell of the array 43 is comprised of a variable threshold transistor of the type described in said U.S. Pat. No. 3,590,337. Each row of the rectangular array 43 comprises a word thereof and the columns of the array 43 comprise the respective bits of the words. For example, word 1 is comprised of 16 transistors, the first two and the last of which are illustrated at 44, 45 and 46. The gates of all of the transistors in a word are commonly connected to one of the outputs of the addressing buffer 33. For example, the gates of word 1 are connected to the output 34 of the buffer 33.

Each column of transistors in the array 43 has associated therewith an I/0 control circuit which, in turn, is connected to an I/0 buffer circuit which provides a TTL compatible output, i.e., 0 or 5 volts d.c. in accordance with the stored bit. For example, the bit 1 column of the memory array 43 is connected to I/0 control circuit 47 which is, in turn, connected to an associated I/0 buffer circuit 50 that provides the TTL compatible bit 1 output from the selected memory word at a terminal 51. It will be appreciated that fifteen I/0 control and buffer circuits (not shown) identical to the circuits 47 and 50 respectively are included on the chip 10 and connected to the respective bit 2 through bit 16 columns in the manner illustrated for the bit 1 column.

The commonly connected sources of the transistors in the bit 1 column are connected via a lead 52 and a fixed threshold field effect gating transistor 53 to the $V_{CC}$ power supply at a terminal 54. The commonly connected drains of the transistors in the bit 1 column are connected via a lead 55 and a load transistor 56 to the $V_{R/W}$ potential at a terminal 57. With these connections each bit of a selected word functions as an inverter which is either on or off, depending on the threshold setting of the memory transistor in a manner to be further described herein below. The I/0 control circuit 47 additionally includes switching transistors 61, 62 and 63 as well as a load transistor 64 connected as illustrated and functioning in a manner to be described.

The I/0 buffer 50 includes push-pull connected transistors 65 and 66 that provide the bit 1 output signals on the terminal 51. The buffer 50 additionally includes switching and gating transistors 70, 71 and 72 as well as a load transistor 73 connected with the transistors 65 and 66 as well as with the I/0 control circuit 47 as illustrated to function in a manner to be described.

The chip 10 also includes a memory control circuit 74 receiving R/W and CS control signals at terminals 75 and 76 respectively and providing outputs to the address decoders 21 as well as to the I/0 control and buffer circuits 47 and 50. It will be appreciated that the control circuit 74 provides signals to the 8 address decoders of which only the decoder 21 is illustrated as well as to the 16 I/0 control and buffer circuits of which only the circuits 47 and 50 are illustrated. The control circuit 74 is comprised of switching transistors 80, 81, 82 and 83 as well as load transistors 84, 85 and 86 connected as illustrated to function in a manner to be described.

In operation, the two control inputs R/W and CS in conjunction with the levels applied to the clear ($V_C$) and READ/WRITE ($V_{R/W}$) voltage inputs are utilized to select the operating states of the memory. Memory operation comprises a memory bulk clear followed by a programmed write. The memory is then ready to be utilized in its read only mode. The clear, write and read operations permit a given memory chip to be programmed for any specific application or to be updated within a single application without affecting the programs stored on other chips in the system. This chip selection is controlled by the CS input. The operating states of the memory are controlled in accordance with the following table:

OPERATIONAL TRUTH TABLE

| State | Control Inputs | | Voltage Inputs | |
|---|---|---|---|---|
| | R/W | CS | $V_C$ | $V_{R/W}$ |
| Read | $+V_{cc}$ | $+V_{cc}$ | $+V_{cc}$ | $-V_{READ}$ |
| Clear | $+V_{cc}$ | $+V_{cc}$ | $+V_{CLEAR}$ | $-V_{READ}$ |
| Write | 0 V | $+V_{cc}$ | $+V_{cc}$ | $-V_{WRITE}$ |
| Non- | — | 0 V | — | — |

-continued

| State | Control Inputs R/W CS | Voltage Inputs $V_C$ $V_{R/W}$ |
|---|---|---|
| Select | | |

Since P-channel variable threshold transistors are utilized in the memory array 43, raising the gate potential of a memory transistor approximately +30 volts with respect to its substrate establishes the least negative threshold for the transistor whereas applying approximately −30 volts to the gate with respect to the substrate establishes the most negative threshold for the transistor. When a potential intermediate to these two thresholds is applied to the gate with respect to the substrate, the transistor is rendered conductive when the least negative threshold had been previously established but remains non-conductive when the most negative threshold had been previously established. These operations with regard to the variable threshold transistors of the memory array 43 are further described in the aforesaid patents.

Thus it is appreciated with regard to the above table that the $V_{CLEAR}$ voltage is selected at approximately +30 volts d.c. and the $V_{WRITE}$ potential is selected at approximately −30 volts d.c. As previously described, the $V_{CC}$ voltage is approximately +5 volts d.c. and is derived from the system power supply. Additionally, the $V_{READ}$ potential is derived from the $V_{GG}$ power supply and is approximately −12 volts d.c.

The memory clear, programmed write and read-only modes are effected by application of the potentials as delineated in the above table.

For the read operation it will be assumed that the memory transistors of the array 43 have been cleared and selectively set in the manner to be further described to establish a desired program. During a read operation the two control inputs, R/W and CS, are HIGH, i.e., at the $+V_{CC}$ level. Thus the control transistors 80, 81 and 82 are rendered non-conductive with the resultant low level from the transistor 84 placed on the gates of the transistors 83, 53, 63 and 70 rendering these transistors conductive. With the transistor 83 conductive a HIGH level is placed on the gate of the transistor 72. The turning on of the transistor 63 places a HIGH level on the gate of the transistor 61 maintaining it non-conductive and the conductive state of the transistors 53 and 70 enables the I/0 control circuit 47 as well as the I/0 buffer circuit 50. The HIGH level at the gate of the transistor 72 maintains it non-conductive permitting the transistor 71 to control the output terminal 51.

With the transistor 82 in the non-conductive state, the transistor 85 provides a LOW on the line 32 which renders the enabling trasistors 24 of the address decoders 21 conductive thereby enabling the address decoders. The address input terminals 11–14 and the address inverters 15 provide the true and complement inputs required for decoding the desired memory word line as described above. As previously explained, the one of 16 word line outputs selected by the address decoder has a HIGH level placed thereon whereas the remaining non-selected word lines are at a LOW level. During the reading operation as indicated by the above table, the $+V_{CC}$ power supply potential is applied to the $V_C$ terminal of the address buffer 33 while the $-V_{READ}$ potential is applied to the $V_{R/W}$ terminal thereof as well as to the terminal 57. The HIGH level on the selected word output from the address decoder 21 turns the selected buffer driver transistor (corresponding to the transistor 36) off thus permitting the $-V_{READ}$ level to be applied to the selected word line of the memory array 43 through the associated transistor (corresponding to the transistor 37). The LOW level on the remaining non-selected inputs to the address buffer 33 renders conductive all the associated transistors 36 placing a HIGH on all of the non-selected word lines of the memory array 43, thus maintaining all of the transistors of the non-selected memory words in a non-conductive state. Assuming that the word 1 is selected and considering the bit of word 1 represented by the memory transistor 44, if the previously established threshold voltage of the transistor 44 is more negative than the $V_{READ}$ level applied to the gate thereof, the transistor 44 will remain in its non-conductive state and the output of the memory bit line 55 will be the $V_{READ}$ level minus the threshold voltage and the back gate voltage loss of the associated memory load transistor 56. This LOW output level on the line 55 renders the transistor 65 conductive placing a HIGH on the output terminal 51. The LOW level on the line 55 also renders the transistor 71 conductive which places a HIGH level on the gate of the transistor 66 rendering it non-conductive.

If, however, the previously established threshold voltage of the memory transistor 44 is less negative than the $V_{READ}$ level, the memory trasistor 44 will be rendered conductive and the output of the memory bit line 55 will be HIGH. This HIGH level will render the transistors 65 and 71 non-conductive, the resulting low level at the gate of the transistor 66 rendering the transistor 66 conductive, pulling the bit output terminal 51 to ground potential.

It is appreciated that each of the bits of the selected word controls its respective output terminal providing a parallel readout of the bits of the selected word at voltage levels that are compatible with conventional TTL logic circuits.

In order to perform the bulk clearing operation the control input levels and the voltage input levels are the same as for the reading mode except that the $V_{CLEAR}$ voltage is applied to the $V_C$ terminal of the addressing buffer 33. The $V_{CLEAR}$ level, which is approximately +30 volts d.c., is applied in common to all of the sources of the addressing buffer transistors 36 and is also applied to the isolated substrate of the buffer 33. Thus, all of the buffer driver transistors 36 are rendered conductive irrespective of the word selection signals applied to the gates thereof. In this manner the $V_{CLEAR}$ level is applied to the gates of all of the memory transistors in the array 43. Since the memory substrate is referenced to the $+V_{CC}$ level, the gates of the memory transistors are raised to $+V_{CLEAR}$ above the substrates thereof thereby shifting all of the transistor thresholds to the least negative level, hence clearing the memory.

It will be appreciated that even without the connection 41 to the isolated substrate of the addressing buffer 33, the large positive $V_{CLEAR}$ potential applied to the sources of the transistors 36 would forward bias these P source diffusions with respect to the N substrate, hence pulling the substrate to approximately the $V_{CLEAR}$ level. In the absence of isolation 40 the entire chip 10 would be pulled to this level thus preventing the gates of the memory transistors from assuming a potential difference of $V_{CLEAR}$ with respect to the memory transistor substrates, thereby preventing the bulk clear function.

Since the isolation junction 40 forms an N-P junction with regard to the addressing buffer substrate, this junction is reverse biased by the positive $V_{CLEAR}$ voltage, hence effectively holding this large voltage back from the remainder of the chip 10. It is furthermore appreciated that surrounding the addressing buffer with the isolation junction 40 provides for the least extensive isolation area thereby significantly increasing the manufacturing yield for the devices as discussed above. Additionally, surrounding the addressing buffer 33 with the isolation junction 40 permits the bulk clearing function of the memory to be performed in a significantly more efficacious manner than in the prior art devices discussed above by applying a single unipolarity pulse to a single terminal on the chip.

After all of the transistors in the memory array 43 are cleared to their least negative threshold, the thresholds of selected memory transistors are driven to their most negative threshold in the writing mode of operation in order to establish a desired data content for the memory. The memory writing is performed in a manner similar to that described in said U.S. Pat. Nos. 3,618,051; 3,691,535 and 3,747,072. In the write mode for the memory arrangement illustrated in the figure, the inputs are the same as for the read mode except that a LOW is placed on the R/W terminal 75 and the negative $V_{WRITE}$ voltage is applied to the $V_{R/W}$ terminal to the address buffer 33 and to the terminal 57. The LOW at the R/W input 75 renders the transistor 80 conductive thus applying a HIGH level to the gates of the transistors 83, 53, 63 and 70 which HIGH level renders these transistors non-conductive. Additionally, since the transistor 83 is non-conductive, a LOW level is applied from the transistor 86 to the gate of the transistor 72 rendering the transistor conductive. The non-conductive condition of the transistors 53 and 63 permits the level at the common drain line 55 of the memory transistors in the bit 1 column to be under control of an information signal applied to the I/O bit 1 terminal 51. Since the transistor 70 is non-conductive and the transistor 72 is conductive, thereby turning off the transistor 66, the I/O bit 1 terminal 51 may be driven externally to control the information written into the memory transistor in the bit 1 column of the selected word.

In the write mode the address decoders 21 and the addressing buffer 33 operate in the manner described above with respect to the read mode. However, a $V_{WRITE}$ level is now applied to the $V_{R/W}$ inputs. With a LOW data level applied to the I/O bit 1 terminal 51, the transistor 62 will be rendered conductive and the resultant HIGH level at the gate of the transistor 61 will render the transistor 61 non-conductive. The $V_{WRITE}$ level applied at the terminal 57 appears via the common drain line 55 at the drain of the bit 1 memory transistor in the selected word and the same $V_{WRITE}$ potential appears at the gate of the bit 1 transistor of the selected word causing the P-channel of the transistor to be at the $V_{WRITE}$ level. Thus, writing into the bit 1 memory transistor of the selected word is inhibited because there isn't any net voltage across the gate insulator of the transistor. If, however, a HIGH level is applied to the I/O bit 1 terminal 51, the transistor 62 will be rendered non-conductive, thus causing the load transistor 64 to apply a LOW to the gate of the transistor 61 rendering the transistor 61 conductive. This applies a HIGH level to the drain line 55 of the bit 1 transistor in the selected word resulting in the P-channel of the memory transistor to be at the HIGH level. Since the appropriate negative voltage now appears across the gate insulator of the memory transistor, the threshold thereof is shifted to its most negative level thereby performing the selective write function.

It will be appreciated that data is simultaneously written into the remaining memory transistors of the selected word by the I/O control and buffer circuits (not shown) identical to the circuits 47 and 50 and connected respectively to the bit columns 2 through 16 of the memory array 43 as described above. The data signals are applied in parallel to the terminals corresponding to the terminal 51.

The entire memory chip illustrated in the figure may be disabled in a non-select mode by applying a LOW level to the CS input terminal 76. This causes the transistors 81 and 82 to turn on thereby disabling the address decoders 21 and the push-pull output of the I/O buffer 50. Thus, in a system utilizing a plurality of memory chips the outputs thereof may be connected together in multiplexed fashion with the desired chip selected using the CS input terminal 76. It should be noted that chip select is only effective in the read or write modes.

It will be appreciated from the foregoing that for efficacious circuit operation and to provide external control of voltage levels necessary for the memory transistors, a two transistor address buffer circuit is connected to each word line of the memory array 43. Locating the address buffer 33 on an isolated substrate permits clearing the entire memory by applying a unipolar voltage pulse to a single terminal. The address buffer 33 also functions to direct read and write voltages to the memory word line determined by the address decoder outputs. During the clearing operation the address buffer 33 functions as a non-selective switch connecting the positive clear voltage $V_{CLEAR}$ applied to the $V_C$ terminal to the gates of all of the memory transistors independently of the word selected by the decoder. During the read and write operations the address buffer 33 functions as a selective level shifter enabling the read or write voltages to be applied to the memory word line selected by the decoder. This type of buffer operation, non-selective clear and selective write, is rendered feasible by the novel configuration of providing isolation of the addressing buffer substrate from the remainder of the chip 10. Since the address buffer 33 is the smallest portion of the semiconductor chip 10 in terms of area, the minimal isolation junction required provides the beneficial effects discussed hereinabove.

It will be appreciated that although the power supply, control and voltage level input terminals are illustrated throughout the chip 10, these terminals are actually located at the edge of the chip for ease of connection, the chip 10 being depicted as illustrated for puposes of simplicity. Although the preferred embodiment of the invention was described in terms of a 256 bit memory, other size memories constructed in accordance with the invention may also be utilized. The address decoders 21 are shown utilizing serially connected transistors. Parallel connected transistors may also be utilized to perform the address decoding function to the same effect. The above described embodiment of the invention was explained in terms of an epitaxial N-region deposited on a P-bulk material with an isolation diffusion 40 surrounding the address buffer 33. It will be appreciated that the N-layer could be deposited on other materials such as sapphire with the isolation of the address buffer substrate provided by etching the N-layer down to the sapphire bulk material to form an isolation moat surrounding the address buffer 33.

Although the present invention is preferably utilized and is hereinabove described in the environment of a word organized memory, it will be appreciated that the invention may also be employed with other memory organizations such as coincident select and the like. Additionally, the preferred embodiment of the invention is described above in terms of utilizing one conductivity type fixed threshold field effect transistors for the peripheral circuitry of the memory array 43. It will be appreciated that complementary field effect transistors (utilizing both N and P-channel devices) or other types of transistors such as PNP or NPN devices and the like may be utilized in fabricating the peripheral memory circuits.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A digital memory comprising
   semiconductor substrate means,
   an array of variable threshold field effect transistors formed on said substrate means,
   each said variable threshold transistor having a source and a drain formed in said substrate means with a gate electrode therebetween insulated from said substrate means,
   each said variable threshold transistor having a first conduction threshold established by applying a clearing potential to said gate electrode with respect to said substrate means and a second conduction threshold established by applying a writing potential to said gate electrode with respect to said substrate means, said clearing and writing potentials being of opposite polarity with respect to each other,
   first terminal means for applying said clearing potential to said memory,
   second terminal means for applying said writing potential to said memory,
   third terminal means for applying addressing signals to said memory,
   said addressing signals being coded for selection of predetermined groups of said variable threshold transistors,
   address decoder circuit means having a plurality of decoder outputs and coupled to said third terminal means for selectively energizing said decoder outputs in accordance with said addressing signals,
   address buffer circuit means coupled to said decoder outputs and including fixed threshold transistors coupling said first and second terminal means to said gate electrodes of said variable threshold transistors,
   said fixed threshold transistors being formed in said substrate means whereby one of said clearing and writing potentials is of a polarity to be coupled to said substrate means through forward biased junctions of said fixed threshold transistors, and
   isolation means surrounding said addressing buffer circuit means for electrically isolating the portion of said substrate means associated with said address buffer circuit means from the remainder of said substrate means whereby both said clearing and writing potentials can be established between said gate electrodes of said variable threshold transistors and said substrate means associated therewith.

2. The memory of claim 1 in which
   said array comprises a rectangular arrangement of said variable threshold transistors into word rows and bit columns where said gate electrodes of said variable threshold transistors in each row are commonly connected, and
   said predetermined groups of said variable threshold transistors comprise said word rows respectively.

3. The memory of claim 2 in which said first terminal means comprises a single clear terminal coupled through said addressing buffer circuit means to said gate electrodes of all of said variable threshold transistors of said array, whereby said first conduction threshold is simultaneously established in all of said variable threshold transistors by application of said clearing potential to said single clear terminal thereby clearing said memory.

4. The memory of claim 3 in which said addressing buffer circuit means comprises a plurality of address buffer circuits having inputs coupled to said decoder outputs respectively for selectively enabling said buffer circuits in accordance with said selectively energized decoder output, and having outputs coupled to said commonly connected gates of said word rows respectively,
   said clear terminal being connected to all of said buffer circuits for simultaneous connection of said clearing potential to said commonly connected gates of all of said word rows,
   said second terminal means being connected to all of said buffer circuits for selective connection to said commonly connected gates of said word rows in accordance with said selectively enabled buffer circuit.

5. The memory of claim 4 in which said fixed threshold transistors comprise field effect transistors having respective sources and drains formed in said substrate means with respective gate electrodes therebetween.

6. The memory of claim 5 in which each said addressing buffer circuit comprises first and second serially connected field effect transistors, said buffer circuit input comprising said gate electrode of said first transistor and said buffer circuit output comprising the junction between said first and second transistors, said sources of all said first transistors being commonly connected to said clear terminal and said drains and gate electrodes of all of said second transistors being commonly connected to said second terminal means.

7. The memory of claim 6 in which said substrate means associated with said addressing buffer circuit means includes an electrical contact connected to said clear terminal.

8. The memory of claim 5 in which
   said substrate means comprises a relatively thick bulk layer of semi-conductor material of one conductivity type and a superposed relatively thin layer of semiconductor material of the other conductivity type,
   said variable and fixed threshold field effect transistors being formed in said thin layer, and said isolation means comprises a deep diffusion of semi-conductor material of said one conductivity type disposed through said thin layer to contact said bulk layer.
9. The memory of claim 5 in which
said substrate means comprises a relatively thick bulk layer of sapphire and a superposed relatively thin layer of semi-conductor material,
said variable and fixed threshold field effect transistors being formed in said thin layer, and
said isolation means comprises a moat disposed through said thin layer to said bulk layer.

* * * * *